US012763157B2

(12) United States Patent
Eyal et al.

(10) Patent No.: US 12,763,157 B2
(45) Date of Patent: Oct. 13, 2026

(54) MEMORY PROGRAMMING SCHEMES WITH ADJUSTABLE VERIFICATION VOLTAGES FOR REDUCING DATA RETENTION LOSS

(71) Applicant: Apple Inc., Cupertino, CA (US)

(72) Inventors: Alon Eyal, Zichron Yaakov (IL); Alexander Bunin, Ganei Tikva (IL); Michael Tsohar, Givat Shmuel (IL); Nir Tishbi, Kfar Saba (IL); Asaf Rotenberg, Tel Aviv (IL)

(73) Assignee: Apple Inc., Cupertino, CA (US)

( * ) Notice: Subject to any disclaimer, the term of this patent is extended or adjusted under 35 U.S.C. 154(b) by 62 days.

(21) Appl. No.: 18/775,017

(22) Filed: Jul. 17, 2024

(65) Prior Publication Data

US 2026/0024596 A1 Jan. 22, 2026

(51) Int. Cl.

*G11C 16/34* (2006.01)
*G11C 13/00* (2006.01)
*G11C 16/10* (2006.01)

(52) U.S. Cl.

CPC ...... *G11C 16/3459* (2013.01); *G11C 13/0033* (2013.01); *G11C 16/10* (2013.01); *G11C 16/3418* (2013.01); *G11C 16/3427* (2013.01); *G11C 16/3436* (2013.01); *G11C 2211/5621* (2013.01)

(58) Field of Classification Search

CPC . G11C 16/3459; G11C 13/0033; G11C 16/10; G11C 16/3418; G11C 16/3427; G11C 16/3436; G11C 2211/5621

See application file for complete search history.

(56) References Cited

U.S. PATENT DOCUMENTS

| | | | |
|---|---|---|---|
| 5,751,637 A | 5/1998 | Chen et al. |
| 6,166,962 A | 12/2000 | Chen et al. |
| 7,139,192 B1 | 11/2006 | Wong |
| 7,177,199 B2 | 2/2007 | Chen et al. |
| 7,408,804 B2 | 8/2008 | Hemink et al. |

(Continued)

OTHER PUBLICATIONS

Bez et al., "Introduction to Flash Memory", Proceedings of the IEEE, vol. 91, No. 4, Apr. 2003, pp. 489-502.

Eitan et al., "Multilevel Flash Cells and their Trade-Offs", Proceedings of the 1996 IEEE International Electron Devices Meeting (IEDM), pp. 169-172.

(Continued)

*Primary Examiner* — Donald HB Braswell
(74) *Attorney, Agent, or Firm* — Meitar Patents LTD.; Daniel Kligler

(57) ABSTRACT

An apparatus for data storage includes circuitry and a plurality of memory cells. The memory cells are coupled to word lines (WLs), and are configured to store data values in respective predefined programming levels. The circuitry is configured to: receive data values for storage in the memory cells of a given WL, select memory cells of the given WL that are to store a given data value among the received data values, set a verification voltage for programming the selected memory cells, so that a difference between the verification voltage and a read voltage predetermined for the selected memory cells depends on a rate of drift that is expected to occur to a threshold voltage distribution associated with the selected memory cells when programmed, apply one or more programming pulses to the given WL, and verify that the selected memory cells have been programmed successfully using the set verification voltage.

12 Claims, 5 Drawing Sheets

(56) References Cited

U.S. PATENT DOCUMENTS

| | | | | |
|---|---|---|---|---|
| 7,678,674 | B1 | 3/2010 | Sinha et al. | |
| 8,050,086 | B2 | 11/2011 | Shalvi et al. | |
| 8,446,778 | B2 | 5/2013 | Kim | |
| 8,593,884 | B2 | 11/2013 | Park et al. | |
| 8,806,106 | B2 | 8/2014 | Goss et al. | |
| 2007/0121383 | A1 | 5/2007 | Chen et al. | |
| 2007/0195602 | A1 | 8/2007 | Fong et al. | |
| 2008/0151667 | A1 | 6/2008 | Miu et al. | |
| 2009/0199074 | A1 | 8/2009 | Sommer | |
| 2009/0319868 | A1 | 12/2009 | Sharon et al. | |
| 2012/0124273 | A1 | 5/2012 | Goss et al. | |
| 2014/0225181 | A1 | 8/2014 | Makala et al. | |
| 2015/0169398 | A1 | 6/2015 | Chunn et al. | |
| 2020/0265904 | A1* | 8/2020 | Li | G11C 16/08 |
| 2023/0238067 | A1* | 7/2023 | Zhao | G11C 16/12<br>365/185.22 |
| 2024/0412793 | A1* | 12/2024 | Lee | G11C 16/10 |

OTHER PUBLICATIONS

Eitan et al., "Can NROM, a 2-bit, Trapping Storage NVM Cell, Give a Real Challenge to Floating Gate Cells"? Proceedings of the 1999 International Conference on Solid State Devices and Materials (SSDM), pp. 522-524.

Maayan et al., "A 512 Mb NROM Flash Data Storage Memory with 8 MB/s Data Rate", Proceedings of ISSCC 2002 pp. 100-101.

Kim et al."Future Memory Technology including Emerging New Memories", Proceedings of the 24th International Conference on Microelectronics (MIEL), vol. 1, 2004, pp. 377-384.

List of References Cited, U.S. Appl. No. 12/390,522, dated Sep. 23, 2010.

Final Office Action, U.S. Appl. No. 14/219,315, dated Nov. 6, 2015.

List of References Cited, U.S. Appl. No. 14/219,315, dated Feb. 22, 2016.

List of References Cited, U.S. Appl. No. 14/219,315, dated Jul. 24, 2015.

Non Final Office Action, U.S. Appl. No. 14/219,315, dated Feb. 22, 2016.

* cited by examiner

MEMORY PROGRAMMING SCHEMES WITH ADJUSTABLE VERIFICATION VOLTAGES FOR REDUCING DATA RETENTION LOSS

TECHNICAL FIELD

Embodiments described herein relate generally to data storage, and particularly to methods and systems for memory programming schemes for reducing data retention loss.

BACKGROUND

In various storage systems, memory cells store storage values that represent respective data values. The ability to reliably retrieve data from the memory may degrade for various reasons, such as, for example, reduction of the storage values in the memory cells after long retention periods. The reduction in readout reliability due to data retention is also referred to as "data retention loss."

Methods for mitigating reliability degradation in a non-volatile memory are known in the art. For example, a paper entitled "A Review of Cell Operation Algorithm for 3D NAND Flash Memory," published in Applied Sciences, October 2022, describes schemes for mitigating storage reliability degradation due to issues such as data retention loss and capacitive coupling between neighbor memory cells.

U.S. Patent Application Publication 2007/0189,073 describes a non-volatile memory device and programming process that for compensates coupling effects on threshold gate voltages of adjacent floating gate or non-conductive floating node memory cells by adjusting the threshold voltage level programmed in view of the data being programmed on a following programming cycle into adjacent memory cells, so that the coupling effect results in the desired target threshold voltages for the cells. In one embodiment, memory cell coupling is compensated for by adjusting programming level of one or more memory cells of a first page a memory array to a higher or lower threshold verify target voltage given the data/programming level to be written to directly adjacent memory cells of a second page, so that coupling between the directly adjacent memory cells of the first and second pages brings the memory cells of the first page to their final target programming level.

SUMMARY

An embodiment that is described herein provides an apparatus for data storage, including storage circuitry and a plurality of memory cells. The memory cells are coupled to multiple word lines (WLs), and are configured to store data values in multiple respective predefined programming levels. The storage circuitry is configured to: receive data values for storage in the memory cells of a given WL, select memory cells of the given WL that are to store a given data value among the received data values, set a verification voltage for programming the selected memory cells, so that a difference between the verification voltage and a read voltage predetermined for the selected memory cells depends on a rate of drift that is expected to occur to a threshold voltage distribution (TVD) associated with the selected memory cells when programmed, apply one or more programming pulses to the given WL, and verify that the selected memory cells have been programmed successfully using the set verification voltage.

In some embodiments, the storage circuitry is configured to set the verification voltage based at least on the given data value. In other embodiments, the storage circuitry is configured to receive neighbor data values for storage in neighbor memory cells in an adjacent WL, and to set the verification voltage for the selected memory cells whose neighbor memory cells are to be programmed to a given neighbor data value, based both on the given data value and on the given neighbor data value. In yet other embodiments, the storage circuitry is configured to hold a predefined dependency between verification voltages and (i) the given data value, and (ii) one or both of a first neighbor data value previously stored in first neighbor memory cells neighboring the selected memory cells, and a second neighbor data value to be programmed in second neighbor memory cells neighboring the selected memory cells, and to set the verification voltage using the predefined dependency.

In an embodiment, the storage circuitry is configured to read neighbor memory cells previously programmed in an adjacent WL using one or more read thresholds that divide a threshold voltage axis to two or more ranges, and to set the verification voltage based on the given data value and on the ranges to which the neighbor memory cells belong. In another embodiment, the storage circuitry is configured to program the selected memory cells using a coarse programming phase and a fine programming phase, and to set the verification voltage for performing the fine programming phase. In yet another embodiment, the storage circuitry is configured to verify that the selected memory cells have been programmed successfully by using the set verification voltage for reading the selected memory cells.

In some embodiments, the storage circuitry is configured to verify that the selected memory cells have been programmed successfully by sensing the selected memory cells for a sensing duration that depends on the verification voltage. In other embodiments, the storage circuitry is configured to verify that the selected memory cells have been programmed successfully by setting a predefined bias voltage to bit lines to which the selected memory cells are coupled, so that the bias voltage depends on the verification voltage.

There is additionally provided, in accordance with an embodiment that is described herein a method for data storage, including: in a storage apparatus that includes a plurality of memory cells coupled to multiple word lines (WLs), the memory cells store data values in multiple respective predefined programming levels, receiving data values for storage in the memory cells of a given WL. Memory cells of the given WL that are to store a given data value among the received data values are selected. A verification voltage for programming the selected memory cells is set, so that a difference between the verification voltage and a read voltage predetermined for the selected memory cells depends on a rate of drift that is expected to occur to a threshold voltage distribution (TVD) associated with the selected memory cells when programmed. One or more programming pulses are applied to the given WL. The selected memory cells are verified to have been programmed successfully using the set verification voltage.

These and other embodiments will be more fully understood from the following detailed description of the embodiments thereof, taken together with the drawings in which:

DETAILED DESCRIPTION OF EMBODIMENTS

Overview

Figure 1:
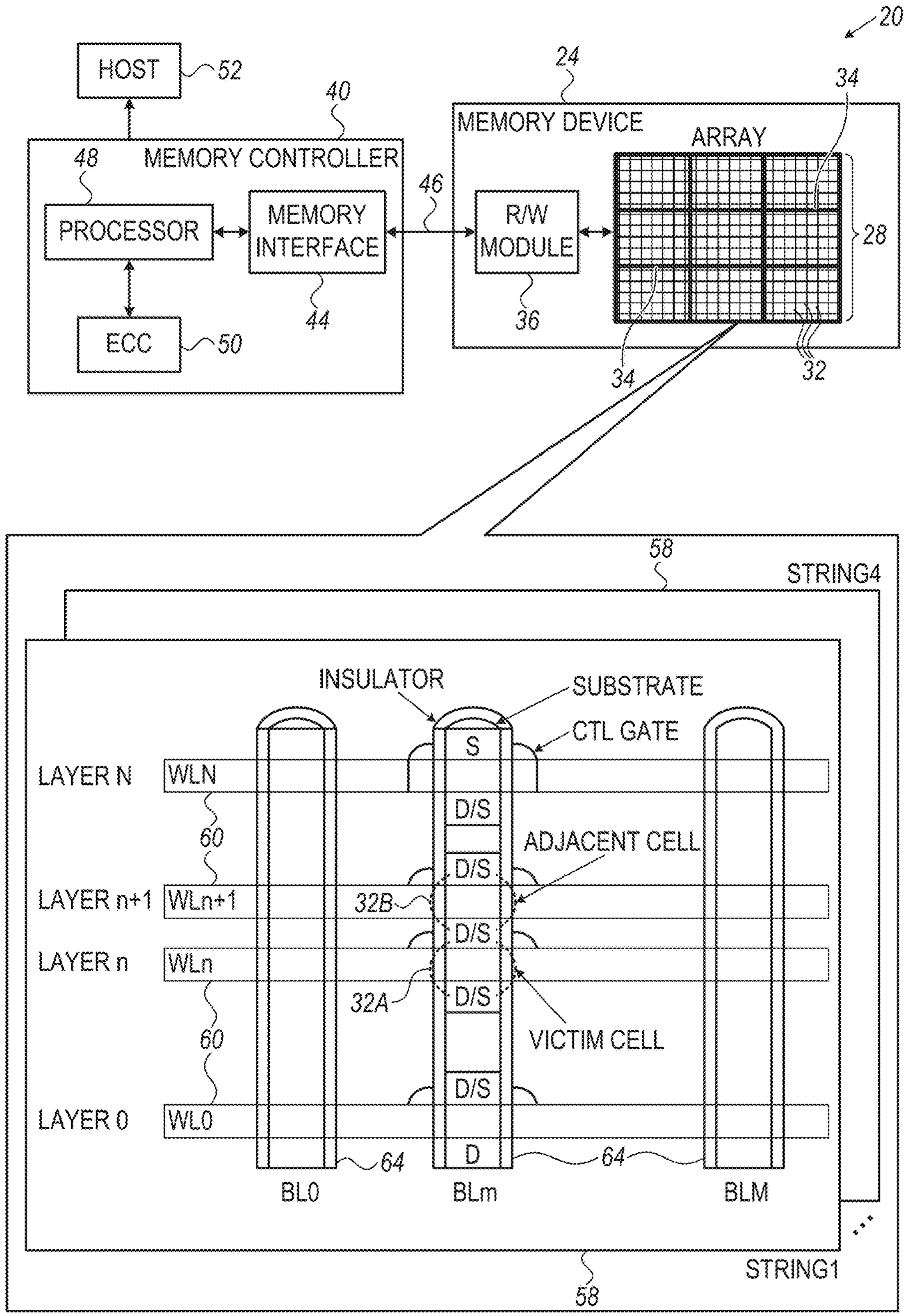
FIG. 1 is a block diagram that schematically illustrates a memory system, in accordance with an embodiment that is described herein.

Embodiments that are described herein, provide improved methods and systems for programming memory cells in a nonvolatile memory, by setting the verification voltages used for program verification based on the rate of drift expected to occur to threshold voltage distributions (TVDs) associated with the memory cells when programmed.

Various types of memory cells (e.g., floating gate cells and charge-trap cells) store data values represented by respective storage values in multiple respective predefined programming levels. The threshold voltages of memory cells that are programmed to a given programming level are typically distributed in accordance with a corresponding TVD.

To read the memory cells, one or more read thresholds are typically set at about mid-points between adjacent programming levels. When the tails of adjacent TVDs overlap, memory cells that were programmed to one programming level may be wrongly identified as programmed to an adjacent programming level. To prevent readout errors, the TVDs need to be sufficiently narrow and separated from one another to avoid or minimize overlap. It is noted that since data is typically stored protected using an error correction code and possibly other recovery schemes, the data retrieved from memory may be recoverable even when TVDs slightly overlap, up to the available correction capabilities. The widths and positions of the TVDs may depend on the underlying programming scheme, and may vary after programming, which may degrade readout reliability.

Memory cells are typically programmed by applying one or more programming pulses to push the storage values in the memory cells above a verification voltage of a corresponding programming level. In the description that follows the storage values are typically in the form of electrical charge, but other suitable types of storage values can also be used. The amount of electrical charge in programed memory cells may depend on the programming scheme used, and may reduce as the memory cells age.

In the description that follows, two major factors that may degrade readout reliability are considered, namely "capacitive coupling" during programming, and "data retention" after programming. Readout reliability may be specified, for example, as the number of errors in a group of memory cells that are read from the memory.

Memory cells are typically programmed in a sequential order of WLs. Due to capacitive coupling between neighbor memory cells, the threshold voltages of already programmed memory cells (e.g., in WLn) may shift up due to subsequent programming of neighbor memory cells in an adjacent WL (WLn+1), thereby causing widening and shifting up to the TVDs of the previously programmed memory cells (in WLn). A memory cell that causes shift up to the threshold voltage (or storage value) of a neighbor memory cell is also referred to as an "attacker cell" and a memory cell whose threshold voltage (or storage value) has been shifted up by an attacker cell is also referred to as a "victim cell". The amount of shift up caused to the threshold voltage of a victim cell typically depends on the programming levels of both the attacker cell and the victim cell. More specifically, the amount of shift up caused to the victim cell increases with higher attacker programming levels and with lower victim programming levels.

Data retention refers to the ability of memory cells to retain their storage values (e.g., electrical charge) to which they were initially programmed, for long periods of time. Typically, as the memory device ages, the amounts of electrical charge in the memory cells tend to reduce, which results in drift of the corresponding TVDs to lower threshold voltages, and to an undesirable widening of the TVDs. The amounts of TVD drift and widening typically depend on the memory cells own programming levels and on the programming levels of neighbor memory cells. More specifically, the amounts of TVD drift and widening increase for memory cells programmed to higher programming levels and whose neighbor memory cells are programmed to lower programming levels.

The negative effect of data retention and capacitive coupling typically increases with the physical density of the memory cells, e.g., in high density three-dimensional (3D) architectures. Moreover, the capacitive coupling between word lines is typically higher than between bit lines, e.g., because in 3D architectures the distance between WLs is typically much smaller than the distance between bit lines. In addition, the metallic material surrounding the holes of the bit lines creates a Faraday cage effect that also reduces capacitive coupling among bit lines.

In the disclosed embodiments, during programming, for compensating for future TVD drift and widening after a long retention period, the verification voltage for programming is set depending on the expected rate of TVD drift, as will be described in detail below.

Consider an apparatus for data storage, including a storage circuitry and a plurality of memory cells. The memory cells are coupled to multiple WLs and store data values in multiple respective predefined programming levels. The storage circuitry is configured to receive data values for storage in the memory cells of a given WL, to select memory cells of the given WL that are to store a given data value among the received data values, to set a verification voltage for programming the selected memory cells, so that a difference between the verification voltage and a read voltage predetermined for the selected memory cells depends on a rate of drift that is expected to occur to a TVD associated with the selected memory cells when programmed, to apply one or more programming pulses to the given WL, and to verify that the selected memory cells have been programmed successfully using the set verification voltage.

The storage circuitry may set the verification voltage in various ways. For example, set the verification voltage based at least on the given data value. As another example, the storage circuitry receives neighbor data values for storage in neighbor memory cells in an adjacent WL, and sets the verification voltage for the selected memory cells whose neighbor memory cells are to be programmed to a given neighbor data value, based both on the given data value and on the given neighbor data value.

In some embodiments, the storage circuitry holds a predefined dependency between verification voltages and (i) the given data value, and (ii) one or both of a first neighbor data value previously stored in first neighbor memory cells neighboring the selected memory cells, and a second neighbor data value to be programmed in second neighbor memory cells neighboring the selected memory cells, and sets the verification voltage using the predefined dependency.

In an embodiment, the storage circuitry reads neighbor memory cells previously programmed in an adjacent WL using one or more read thresholds that divide a threshold voltage axis to two or more ranges. The storage circuitry then sets the verification voltage based on the given data value and on the ranges to which the neighbor memory cells belong.

Other issues that will be described below include a coarse-fine programming scheme, and ways to set the verification voltage by setting the sensing duration of memory cells and by modifying the bit line bias voltage, depending on the required verification voltage.

In the disclosed techniques, to compensate for TVD drift and widening after a long retention period, the verification voltage to used verify successful programming is set depending on the expected rate of TVD drift. Specifically, memory cells whose TVD has a high expected rate of drift are verified with a verification voltage higher than memory cells whose TVD has a low expected rate of drift. In practice, the verification voltage may be set depending on the data value programmed and on data values of neighbor memory cells already programmed in a previous WL and on data values of neighbor memory cells to be programmed in the next WL.

By using the disclosed techniques, acceptable readout reliability may be retained for longer periods in high density 3D memory devices. Moreover, by using the disclosed techniques, complex methods that are typically applied for optimal readout reliability may be simplified or even omitted, thereby reducing power consumption.

System Description

FIG. 1 is a block diagram that schematically illustrates a memory system 20, in accordance with an embodiment that is described herein. Memory system 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved.

Memory system 20 comprises a Non-Volatile Memory (NVM) device 24, which stores data in a memory array 28 that comprises multiple memory cells 32, such as analog memory cells. The memory cells are arranged in multiple memory blocks 34. In the context of the present patent application, the term "analog memory cell" is used to describe any memory cell that holds a continuous, analog value of a physical parameter, such as an electrical voltage or charge. Memory array 28 may comprise solid-state memory cells 32 of any kind, such as, for example, floating-gate and Charge Trap Flash (CTF) Flash cells, e.g., arranged in a 3D configuration. Alternatively, other suitable types of memory cells and configurations that are affected by cell age and by neighboring cells can also be used. Although the embodiments described herein refer mainly to analog memory, the disclosed techniques may also be used with various other memory types.

The charge levels stored in the memory cells and/or the analog voltages or currents written into and read out of the memory cells are referred to herein collectively as analog values, storage values or analog storage values. Although the embodiments described herein mainly address threshold voltages, the methods and systems described herein may be used with any other suitable kind of storage values. In the description that follows, the terms "analog values" and "threshold voltages" are used interchangeably.

Memory system 20 stores data in analog memory cells 32 by programming the memory cells to assume respective memory states, which are also referred to as programming levels. The programming levels are selected from a finite set of possible levels, and each programming level corresponds to a certain nominal storage value. For example, a 2 bit/cell Multi-Level Cell (MLC) can be programmed to assume one of four possible programming levels by writing one of four possible nominal storage values into the cell. Similarly, a 3 bit/cell device and a 4 bit/cell device, also referred to as a Triple-Level Cell (TLC) and Quad-Level Cell (QLC), can be programmed to assume one of eight and one of sixteen possible programming levels, respectively. A memory cell that stores a single bit (i.e., using two programming levels) is also referred to as a Single-Level Cell (SLC). In general, each programming level (or storge value) represents a dedicated data value stored in the memory cell.

Memory device 24 comprises a reading/writing (R/W) module 36, which converts data for storage in the memory device to analog storage values and writes them into memory cells 32. In alternative embodiments, the R/W module does not perform the conversion, but is provided with voltage samples, i.e., with the storage values for storage in the memory cells. When reading data out of memory array 28, R/W module 36 converts the storage values of memory cells 32 into digital samples having an integer resolution of one or more bits. Data is typically written to and read from the memory cells in data units that are referred to as data pages (or simply pages, for brevity).

For reading a data page, the R/W module typically sets one or more read thresholds, e.g., at about mid-points between adjacent nominal programming levels, and senses the threshold voltages of the memory cells relative to the read thresholds.

Memory system 20 comprises a memory controller 40 that performs storage and retrieval of data in and out of memory device 24. Memory controller 40 comprises a memory interface 44 for communicating with memory device 24, a processor 48, and an Error Correction Code (ECC) module 50. The memory controller communicates with the memory device via memory interface 44 over a communication link 46. Communication link 46 may comprise any suitable link or communication bus, such as, for example, a PCIe bus.

In some embodiments, the memory controller communicates with the memory device storage commands such as erase, program and read commands. The memory controller may communicate with the memory device control commands, e.g., for configuring read thresholds and/or verification thresholds. The disclosed techniques can be carried out by memory controller 40, by R/W module 36, or both. Thus, in the present context, memory controller 40 and R/W module 36 are referred to collectively as "storage circuitry" that carries out the disclosed techniques.

Memory controller 40 communicates with a host 52, for accepting data for storage in the memory device and for outputting data retrieved from the memory device. In some embodiments, ECC module 50 encodes the data for storage using a suitable ECC and decodes the ECC of data retrieved from the memory. ECC module 50 may comprise any suitable type of ECC, such as, for example, Low Density Parity Check (LDPC), Reed-Solomon (RS) or Bose-Chaudhuri-Hocquenghem (BCH), can be used. The word produced by the ECC encoder in a single encoding operation, in accordance with the rules defining the underlying code, is also referred to as a Code Word (CW).

Data read from a group of memory cells may contain one or more errors. The number of errors typically increases when the read threshold used for sensing the memory cells is positioned non-optimally. A read operation fails, for example, when the number of errors in the read data exceeds the ECC capabilities. The number of readout errors also depends on the widths of the TVDs associated with the programming levels and on the amount of separation between adjacent TVDs. The TVD widths and separation may vary during and after programming, which may result in degradation to readout reliability.

Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example memory system configuration, which is shown purely for the sake of conceptual clarity. Any other suitable memory system configuration can also be used. For example, although the example of FIG. 1 shows a single memory device, in alternative embodiments memory controller 40 may control multiple memory devices 24. Elements that are not necessary for understanding the principles of the present disclosure, such as various interfaces, addressing circuits, timing and sequencing circuits and debugging circuits, have been omitted from the figure for clarity.

In the example memory system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor such as processor 48 or other element of the host system. In some embodiments, host 52 and memory controller 40 may be fabricated on the same die, or on separate dies in the same device package.

In some embodiments, processor 48 of memory controller 40, a processor within R/W unit 36 (not shown), or both, comprise general-purpose processors, which are programmed in software to carry out the functions described herein. The software may be downloaded to the processors in electronic form, over a network, for example, or it may, alternatively or additionally, be provided and/or stored on non-transitory tangible media, such as magnetic, optical, or electronic memory.

In the example of FIG. 1, the memory cells are arranged in a Three-Dimensional (3D) configuration in which multiple layers of silicon are stacked vertically. In the present example, the memory cells in the 3D configuration are arranged in multiple strings 58.

In an example configuration of memory array 28, as depicted in the lower part of FIG. 1, memory cells 32 (in a string) are arranged in multiple rows and columns, and each memory cell comprises a charge trap transistor. The control gates (denoted CTL gates) of the transistors in each row are connected by word lines 60, and the sources and drains the transistors in each column are connected by bit lines 64 so that the source and drain of neighbor transistors along the bit line are interconnected. Memory cells 32 of a bit line are stacked vertically, and the bit line connects the memory cells belonging to different respective layers. It is noted that all of the memory cells along the bit line share the same charge trap insulator. In a 3D configuration each word line is shared among multiple strings.

The memory array is typically divided into multiple memory pages, i.e., groups of memory cells that are programmed and read simultaneously from a common word line.

Erasing of the memory cells in memory array 28 is usually carried out in blocks that contain multiple memory pages. Typical memory devices may comprise thousands of erasure blocks, also referred to as "memory blocks" (34).

Due to data retention for long periods of time, the storage values (e.g., amounts of electrical charge) in memory cells 32 may reduce, thereby causing the TVDs to drift to lower threshold voltages. The amount or rate of drift typically depends on own programming levels in WLn and on the programming values of neighbor memory cells programmed in adjacent WLs, WLn−1 and WLn+1.

Due to parasitic capacitive coupling between neighbor memory cells, programming the memory cells in one WL may shift up the threshold voltages of neighbor memory cells that were already programmed. For example, programming a memory cell 32B in WLn+1 may cause the threshold voltage of a victim memory cell 32A that was already programmed to shift up.

Programming Schemes with Verification Voltage Set Depending on Expected Rate of TVD Drift R/W module 36 programs memory cells 32 by applying programming pulses (e.g., voltage pulses) to the memory cells. For example, when memory cells 32 comprise floating-gate or charge trap Flash cells, the R/W module applies programming pulses to the gates of the cells. In a typical Flash device configuration, the gates of multiple cells are connected to a common word line, and the R/W module can program multiple cells in parallel by applying programming pulses to the word line.

The top memory cell in a column is typically coupled to a bit line via a drain select transistor (whose control gate is coupled to the control gates of drain select transistors of other bit lines). To allow the programming of a memory cell in a given bit line, the R/W module typically sets the drain of the relevant drain select transistor to 0 Volts, and opens that drain select transistor by applying a voltage VSGD to its control gate. To inhibit programming of a memory cell in a given bit line, the R/W module sets the voltage of the bit line, which is the source of the drain select transistor of this bit line to a voltage larger than VSGD, thus floating the channel of the bit line, and inhibiting programming. By controlling the voltage of the bit line (between OV and a voltage larger than VSGD), some of the memory cells of the same WL may be programmed, while other are inhibited from being programmed.

A given programming pulse causes a given memory cell to assume a given storage value, which corresponds to a certain level of a physical quantity. For example, in a Flash memory cell, a given programming pulse causes the memory cell to accumulate a given amount of electrical charge, so as to assume a given threshold voltage. The description that follows refers mainly to Flash cells whose charge levels (or threshold voltages) represent stored data (e.g., data values). Alternatively, however, the methods and systems described herein can be used with various other sorts of analog memory cells that hold various other kinds of physical quantities and storage values.

As noted above, after a long period of retention the amounts of electrical charge in the memory cells tend to reduce, which undesirably causes the TVDs to down shift and widen. In the disclosed embodiments, R/W module 36 sets verification s for programming so as to compensate for the expected rate of TVD drift.

Figure 2:
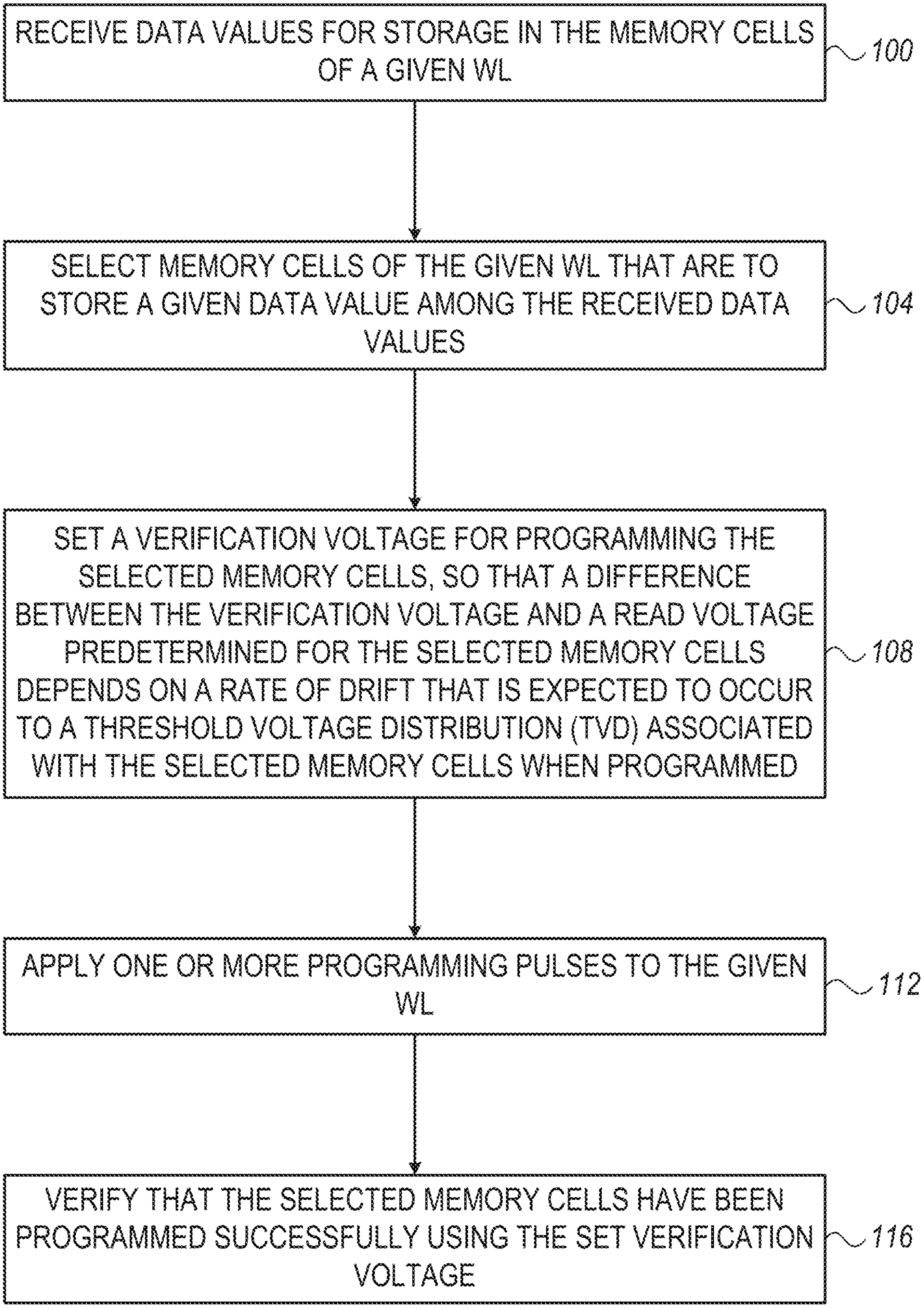
FIG. 2 is a flow chart that schematically illustrates a method for programming memory cells by setting verification voltages depending on expected drift rates caused to threshold voltage distributions (TVDs), in accordance with an embodiment that is described herein.

FIG. 2 is a flow chart that schematically illustrates a method for programming memory cells by setting verification voltages depending on expected drift rates caused to threshold voltage distributions (TVDs), in accordance with an embodiment that is described herein. The TVD drift may be caused after long retention period.

The method begins, at a data reception step 100, with R/W module 36 receiving data values for storage in the memory cells of a given WL. The data values correspond to respective programming levels (PLs). For example, a QLC device can store sixteen 4-bit data values, corresponding to sixteen programming levels.

At a selection step 104, the R/W module selects memory cells of the given WL that are to store a given data value (corresponding to a given programming level) among the received data values.

At a verification voltage setting step 108, the R/W module sets a verification voltage (or multiple verification voltages depending on neighbor cells) for verifying the programming of the selected memory cells. The R/W module sets the verification voltage so that the difference between the verification voltage and a read voltage predetermined for the selected memory cells depends on a rate of drift that is expected to occur to the TVD associated with the selected memory cells, when programmed.

At a programming step 112, the R/W module applies one or more programming pulses to the given WL, and verifies successful programming of the selected memory cells (of the given programming level) using the verification voltage of step 108.

In some embodiments, the selected memory cells of the given programming level are verified using multiple verification voltages that depend on the threshold voltages of the neighboring memory cells. The different settings of the verification voltages for cells having neighbor cells with different threshold voltages may be carried out by controlling the voltage of the bit line, as described above.

At a verification step 116, the R/W module verifies that the selected memory cells have been programmed successfully using the verification voltage(s) of step 108. The R/W module may use various verification criteria. For example, in accordance with an example criterion the programming operation succeeds when all the selected memory cells having the same verification voltage are programmed above that verification voltage. In another verification criterion, the programming operation succeeds when a predefined high percentage of the selected memory cells are programmed above the verification voltage.

Following step 116 (not shown in the figure), the method may loop back to step 104 to select another data value for programming in the given WL, or to step 100 to receive data values for programming to another WL.

The expected rate of TVD drift depends on various factors. For example, the TVD of first memory cells that are programmed to a high programming level is expected to experience a larger rate of drift compared to the TVD of second memory cells that are programmed to a lower programming level. Consequently, in implementing step 108 above, the R/W module sets the verification voltage for the first memory cells with a higher difference from the corresponding read voltage compared to the second memory cells. As another example, the TVD of memory cells programmed to a common data value is expected to experience a larger rate of drift when the corresponding neighbor memory cells in adjacent upper and lower WLs are programmed to a low programming level. In this case, in implementing step 108 above, the R/W module sets the verification voltage with a higher difference from the corresponding read voltage when the neighbor memory cells are programmed to lower programming levels.

In a QLC device, the worst expected rate of drift occurs to memory cells of the highest programming level (PL 16), and whose neighbor cells are erased to the lowest programming level (PL 0).

In some embodiments, at step 108 above, R/W module 36 module sets the verification voltage also to compensate for capacitive coupling between neighbor cells in adjacent WLs. For example, if when programming selected memory cells in WLn, their neighbor memory cells in WLn+1 are to be programmed to a high programming level, which will highly shift up the TVD of the selected memory cells in WLn, the R/W module reduces the verification voltage in WLn, accordingly.

In some embodiments, the R/W module sets the verification voltage based on the data values for storge. As a general requirement, when programming a given data value to selected memory cells in WLn, the R/W module sets the verification voltage based at least on the given data value. When the R/W module has access to neighbor data values for storage in neighbor memory cells in an adjacent word line WLn+1, the R/W module may set the verification voltage for the selected memory cells whose neighbor memory cells are to be programmed to a given neighbor data value, based both on the given data value and on the given neighbor data value.

In an embodiment, the R/W module holds a predefined dependency between verification voltages and (i) the given data value, and (ii) one or both of a first neighbor data value previously stored in first neighbor memory cells neighboring the selected memory cells, and a second neighbor data value to be programmed in second neighbor memory cells neighboring the selected memory cells. In this embodiment, the R/W module sets the verification voltage using the predefined dependency.

In some embodiments, the R/W module sets the verification voltage by roughly evaluating the threshold voltage of previously programmed memory cells. In such embodiments, the R/W module reads neighbor memory cells previously programmed in WLn−1 using one or more read thresholds that divide the overall threshold voltage axis two to or more ranges. The R/W module sets the verification voltage based on the given data value and on the ranges to which the neighbor memory cells belong. As one example, the R/W module may read the neighbor memory cells in WLn−1 using a single read voltage that is positioned at about the middle point of the threshold voltage axis.

Each of the methods that are based on data values as described above may be applied individually. Alternatively, the R/W module may apply two or more of these methods in combination with one another.

FIGS. 3A-3D are diagrams that schematically illustrate TVDs of memory cells programmed with and without drift compensation, in accordance with embodiments that are described herein.

Figures 3A, 3B, 3C, 3D:
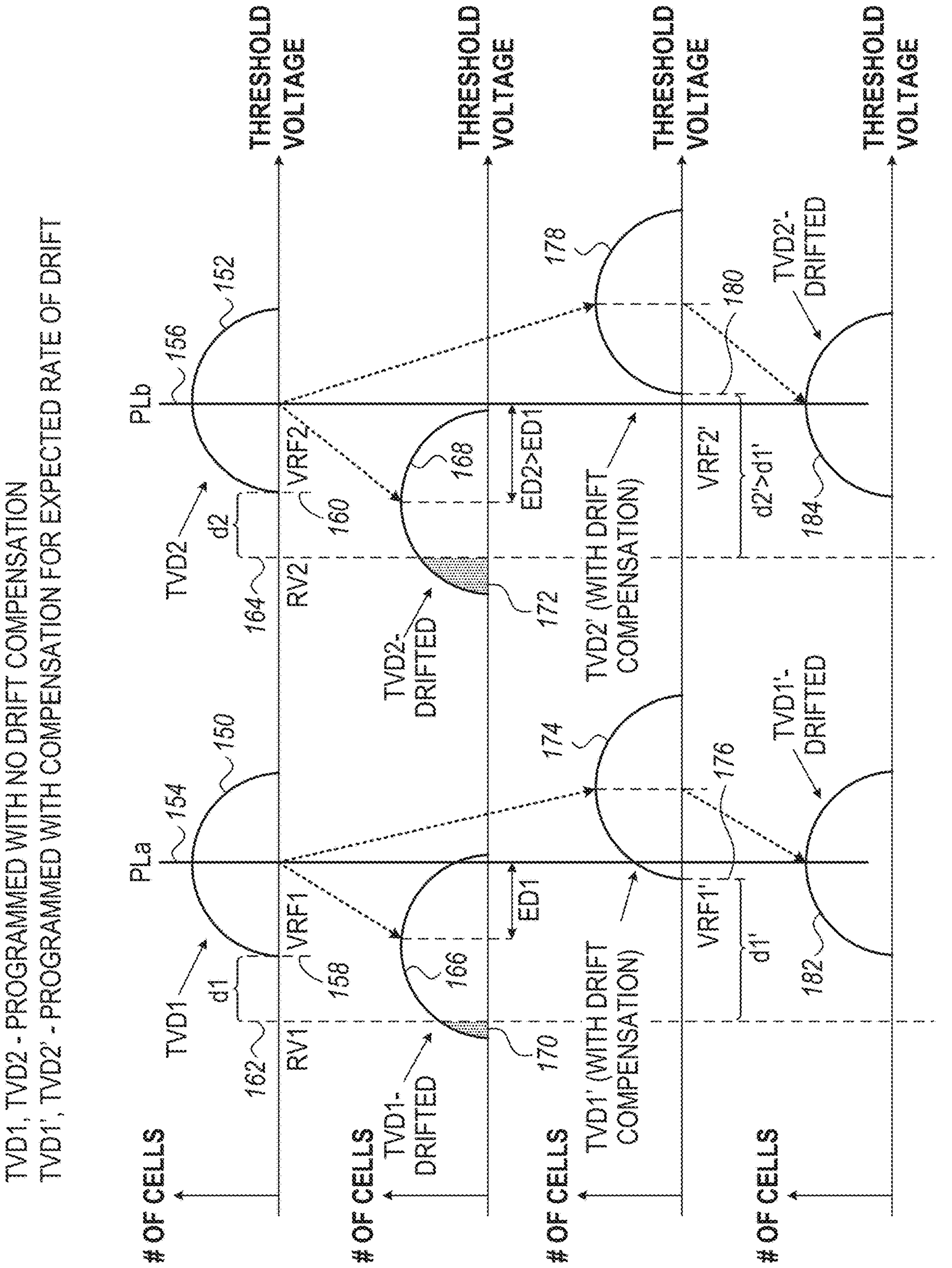
FIGS. 3A-3D are diagrams that schematically illustrate TVDs of memory cells programmed with and without drift compensation, in accordance with embodiments that are described herein.

FIG. 3A depicts TVDs 150 and 152, denoted TVD1 and TVD2 corresponding to memory cells that are programed to respective programming levels 154 and 156 denoted PLa and PLb, without considering expected TVD drift, e.g., due to data retention. For the sake of clarity, only two programming levels of the entire PLS are depicted. Moreover, in the pictured example of FIGS. 3A-3D. PLa and PLb may refer to any two non-adjacent programming levels (excluding the erasure programming level). The programming of the memory cells to PLa and PLb has been verified using respective verification voltages 158 and 160, denoted VRF1 and VRF2. In conventional programming schemes, VRF1 and VRF2 are set without taking into consideration drift of TVDs that is expected due to long retention periods. Read voltages 162 (denoted RV1) and 164 (denoted RV2) are respectively associated with PLa and PLb. RV1 and RV2 may comprise any suitable read voltages, e.g., may be determined optimally by memory controller 40. The difference denoted d1 is given by d1=VRF1−VR1, and the difference denoted d2 is given by d2=VRF2−RV2. Typically, with conventional programming, d1 and d2 are the same, or close to one another.

FIG. 3B depicts TVD1-drifted 166 and TVD2-drifted 168, which represent drifted versions of TVD1 (150) and TVD2 (152) respectively, after a long retention period. As shown in the figure, during the retention period, TVD1 and TVD2 have drifted by respective amounts denoted ED1 and ED2 (which are indicative of corresponding drift rates). Since TVDs of higher programming levels drift at a higher rate than TVDs of lower programming levels, ED2>ED1. As noted above, the amount of expected rate of drift (e.g., ED1 and ED2) typically depends on the programming level and on the programming levels of neighbor memory cells.

In the example of FIG. 3B, TVD1 and TVD2 drifted significantly, and partially crossed the respective read voltages RV1 and RV2. As a result, memory cells whose threshold voltages fall in areas 170 and 172 will be read with errors. To compensate for the expected TVD drift, the memory cells may be initially programmed to higher threshold voltages (using higher verification voltages than VRF1 and VRF2) depending on ED1 and ED2.

FIG. 3C depicts TVDs of memory cells programmed to PLa and PLb using verification voltages elevated to compensate for future TVD drift. Specifically, TVD1' 174 corresponds to memory cells programmed to PLa using a verification voltage VRF1' 176 that is higher than VRF1, and TVD2' 178 corresponds to memory cells programmed to PLb using a verification voltage VRF2' 180 that is higher than VRF2. The R/W module sets VRF1' depending on the TVD1's expected rate of drift (indicated by ED1) and sets VRF2' depending on the TVD2's expected rate of drift (indicated by ED2).

The difference d1' is given by d1'=VRF1'-RV1, and the difference d2' is given by d2'=VRF2'-RV2. In some embodiments, the R/W module sets VRF1' and VRF2' so that d1' depends on ED1, and d2' depends on ED2. As shown in the figure, since ED2>ED1, the inequality d2'>d1' also holds.

FIG. 3D depicts TVD'-drifted 182 and TVD2'-drifted 184. As shown in the figure, due to the programming with drift compensation (as in FIG. 3C), the drifted TVDs 182 and 184 are positioned close to the means of respective TVDs 150 and 152 even after a long retention period. Moreover, in the present example, the drifted TVDs 182 and 184 are positioned well above the respective RVs 162 and 164, which enables error-free readout.

In some embodiments, the R/W module determines the verification voltages by also considering capacitive coupling, e.g., considering data values to be programmed to a subsequent adjacent WL. These embodiments may result in narrower TVDs.

A Program and Verification Scheme with Alternating Coarse and Fine Phases

Figure 4:
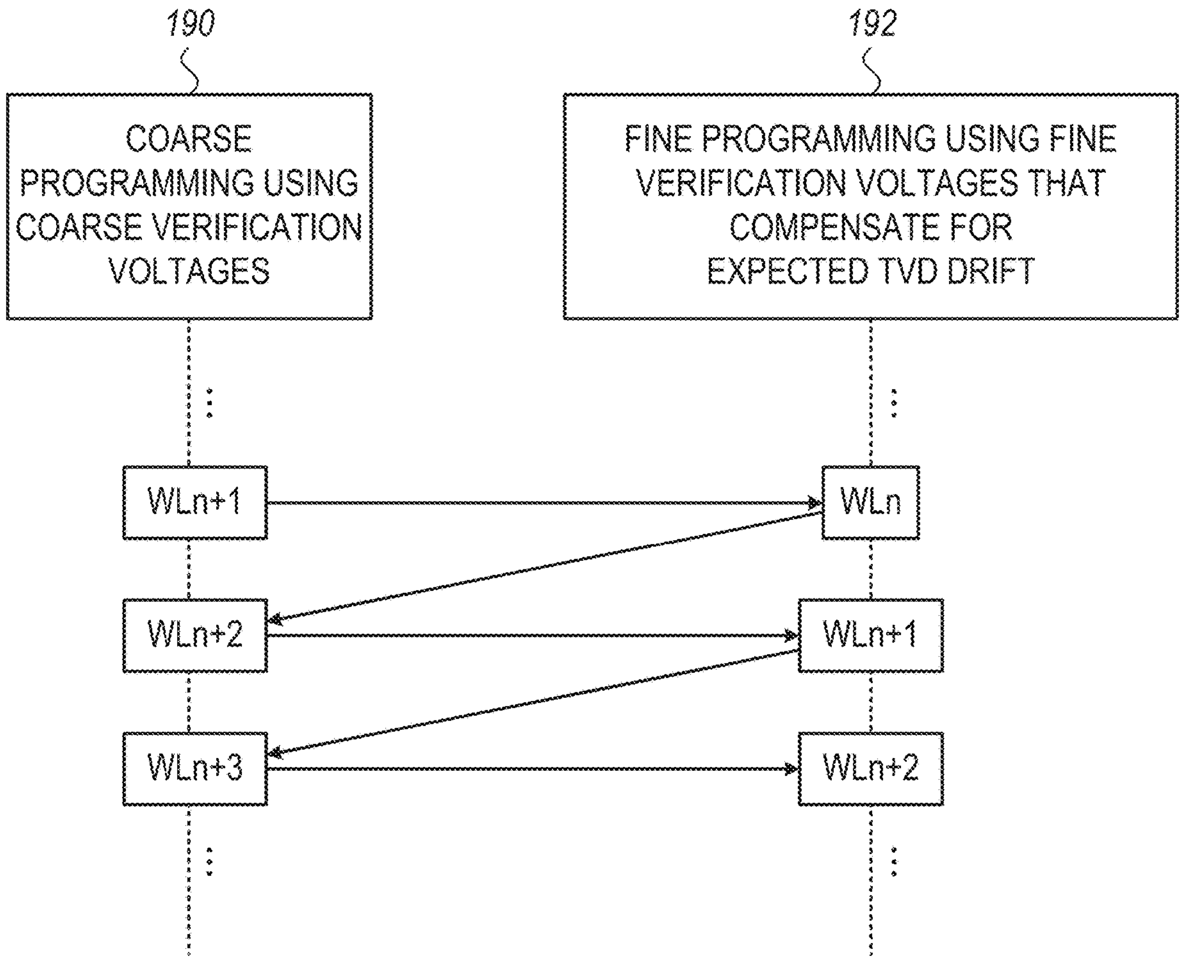
FIG. 4 is a diagram that schematically illustrates a program and verification scheme with alternating coarse and fine phases, in accordance with an embodiment that is described herein.

FIG. 4 is a diagram that schematically illustrates a program and verification scheme with alternating coarse and fine phases, in accordance with an embodiment that is described herein.

In applying a coarse programming phase 190 to a given WL, the R/W module applies one or more programming pulses to that WL and verifies successful programming (e.g., after each programming pulse) using coarse verification voltages that are lower than the final (e.g., default) verification voltages. Moreover, the voltage step between successive programming pulses is relatively large, which results in relatively wide TVDs. In the coarse phase, for a given programming level, the R/W module inhibits further programming of memory cells that were verified successfully (e.g., passed the coarse verification voltage).

In applying a fine programming phase 192 to the given WL (after concluding the coarse programming phase to that WL) the R/W module applies one or more programming pulses to the given WL and verifies successful programming (e.g., after each programming pulse) using fine (final) verification voltages that the R/W module sets to compensate for expected TVDs drift, e.g., due to a long retention period, and possibly also for capacitive coupling effects as described above. Moreover, because verified memory cells are inhibited and the voltage step between successive programming pulses is much smaller than in the coarse phase, the fine phase results in much narrower TVDs compared to the TVDs resulting by the coarse phase.

To achieve narrow TVDs, the R/W module programs the WLs in an order in which fine programming of a given WL is done after coarse programming of the given WL and after coarse programming of the subsequent WL (which may widen the TVDs of the given WL). In FIG. 4, it is assumed that a word line WLn was programmed using the coarse programming phase. Let C(n) and F(n) respectively denote coarse programming and fine programming phases applied to the $n^{th}$ WL. In an embodiment, as depicted in the figure, the order of programming is given by: C(n+1), F(n), C(n+2), F(n+1), C(n+3), F(n+2), and so on.

FIGS. 5A-5D are diagrams that schematically illustrate TVDs resulting by the coarse-fine programming scheme of FIG. 4, in accordance with embodiments that are described herein. The TVDs correspond to selected memory cells in WLn that are programmed to a common data value.

Figures 5A, 5B, 5C, 5D:
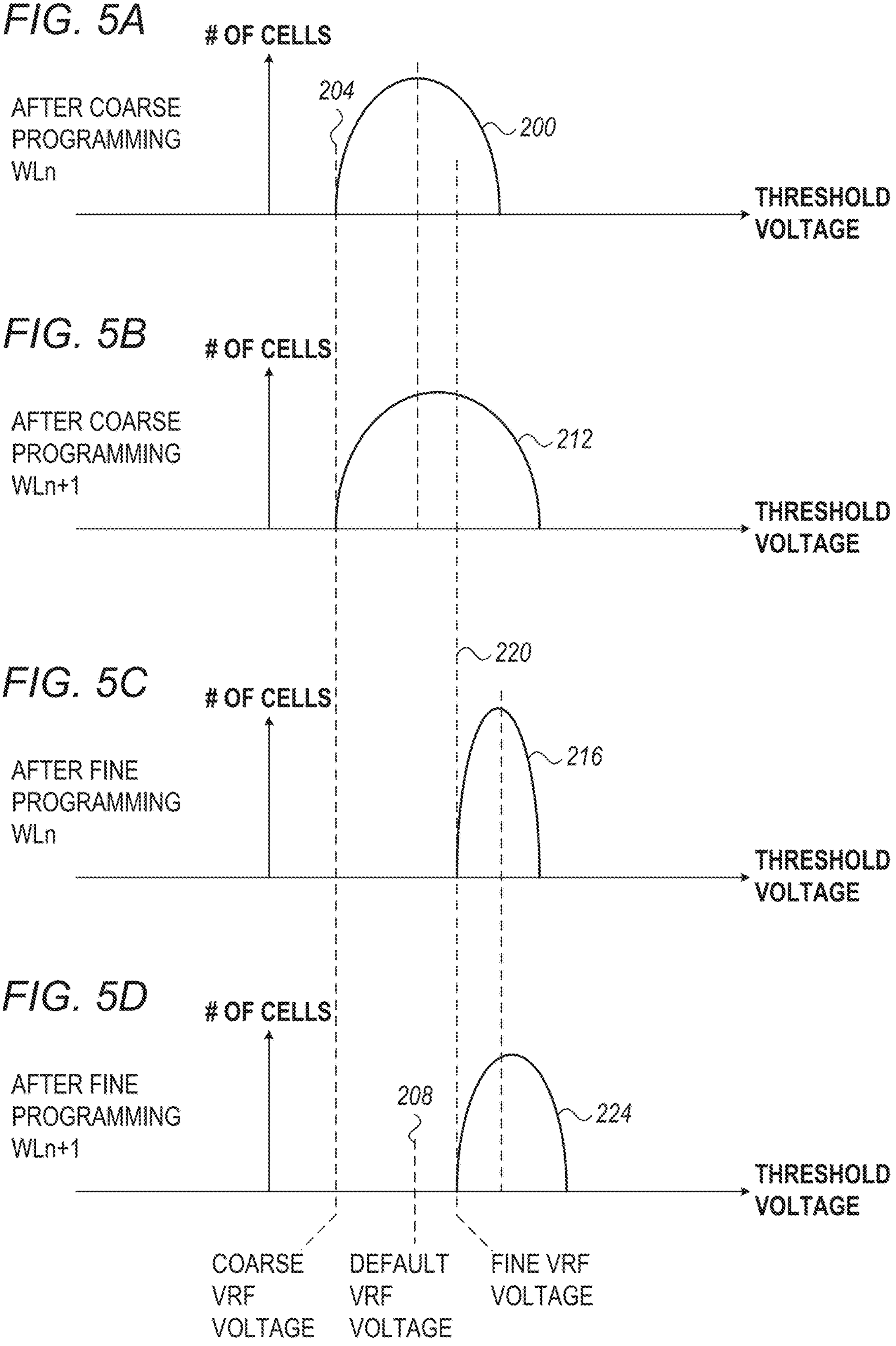
FIGS. 5A-5D are diagrams that schematically illustrate TVDs resulting by the coarse-fine programming scheme of FIG. 4, in accordance with embodiments that are described herein.

FIG. 5A depicts a TVD 200 corresponding to the selected memory cells in WLn after applying coarse programming to WLn with verification using a coarse verification voltage 204 that is lower than a default verification voltage 208. Other TVDs are omitted from the diagram for the sake of clarity. Coarse verification voltage 204 and default verification voltage 208 may be provided, for example, by the vendor of the underlying memory device.

FIG. 5B depicts a TVD 212 related to TVD 200 (of WLn) after applying coarse programming to the memory cells in WLn+1. As shown in the figures, TVD 212 is wider than TVD 200 due to the capacitive coupling between neighbor memory cells in WLn and WLn+1.

FIG. 5C depicts a TVD 216 related to TVD 212 after programming the selected memory cells in WLn and verifying using a fine programming voltage 220. TVD 216 is positioned just above the fine verification voltage and is much narrower than TVD 212. In some embodiments, R/W module 36 sets the fine verification voltage to compensate for expected rate of TVD drift and possibly for capacitive coupling, as described above.

FIG. 5D depicts a final TVD 224 resulting from TVD 216 after applying fine programming to the memory cells in WLn+1. As shown in the figures, TVD 224 is only slightly wider than TVD 216, because the memory cells in WLn+1 were already partially programmed using the coarse programming phase.

Methods for Setting the Verification Voltage

In some embodiments, R/W module 36 determines the verification voltage, and sets the determined verification voltage directly for verifying successful programming. In alternative embodiments, the R/W module sets a default verification voltage (e.g., provided by the memory device vendor) and modifies the sensing duration or bias voltage of the BLs as described herein.

To verify programming, R/W module 36 typically charges a capacitor or junction to a predefined voltage, and then couples the charged capacitor to the BL of the relevant memory cell. The R/W module then enables electrical current to flow through the memory cell (and other memory cells in the column of this BL), thereby discharging the capacitor. After a predetermined default sensing period, the R/W module samples the capacitor voltage to check whether the capacitor voltage is above or below a discharge threshold voltage. If the sampled capacitor voltage is above the discharge threshold voltage the threshold voltage of the memory cell is above the verification voltage, and the verification has succeeded. If the sampled capacitor voltage is below the discharge threshold voltage, the threshold voltage of the memory cell is below the verification voltage, and the verification has failed.

When the sensing duration is increased, the capacitor voltage is more likely to reduce below the discharge threshold voltage, which means that the memory cell has failed verification. Consequently, increasing the sensing duration is equivalent to increasing the verification voltage.

In some embodiments, R/W module 36 sets the default verification voltage and sets the sensing duration depending on the required verification voltage, so that a longer sensing duration corresponds a higher to verification voltage. In some embodiments, the R/W module charges the capacitor once, and samples the capacitor voltage multiple times while being discharged, corresponding to respective verification voltages for verifying memory cells programmed to different programming levels.

To allow electrical current flow through the memory cell during sensing, the R/W module applies a default bias voltage to the relevant BL. The amount of electrical current depends on the bias voltage applied, so that increasing the bias voltage increases the electrical current, which in turn causes faster discharge of the capacitor voltage. This means that increasing the BL bias voltage (e.g., relative to a default bias voltage) is equivalent to increasing the verification voltage.

In some embodiments, the R/W module sets the verification voltage relatively to a default verification voltage, and/or sets the BL bias voltage relatively to a default bias voltage, depending on the required verification voltage.

The embodiments described above are given by way of example, and other suitable embodiments can also be used. For example, the disclosed embodiments for setting the verification voltage depending on the expected TVD drift may be incorporated with any suitable programming scheme.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus for data storage, comprising:
- a plurality of memory cells coupled to multiple word lines (WLs), the memory cells configured to store data values in multiple respective predefined programming levels; and
- storage circuitry, configured to:
  - receive data values for storage in the memory cells of a given WL;
  - select memory cells of the given WL that are to store a given data value among the received data values;
  - set a verification voltage for programming the selected memory cells, so that a difference between the verification voltage and a read voltage predetermined for the selected memory cells depends on a rate of drift that is expected to occur to a threshold voltage distribution (TVD) associated with the selected memory cells when programmed, by:
    - holding a predefined dependency between verification voltages and (i) the given data value, and (ii) one or both of a first neighbor data value previously stored in first neighbor memory cells neighboring the selected memory cells, and a second neighbor data value to be programmed in second neighbor memory cells neighboring the selected memory cells; and
    - setting the verification voltage using the predefined dependency;
  - apply one or more programming pulses to the given WL; and
  - verify that the selected memory cells have been programmed successfully using the set verification voltage.

2. The apparatus according to claim 1, wherein the storage circuitry is configured to read the first neighbor memory cells using one or more read thresholds that divide a threshold voltage axis to two or more ranges, and to set the verification voltage based on the given data value and on the ranges to which the first neighbor memory cells belong.

3. The apparatus according to claim 1, wherein the storage circuitry is configured to program the selected memory cells using a coarse programming phase and a fine programming phase, and to set the verification voltage for performing the fine programming phase.

4. The apparatus according to claim 1, wherein the storage circuitry is configured to verify that the selected memory cells have been programmed successfully by using the set verification voltage for reading the selected memory cells.

5. The apparatus according to claim 1, wherein the storage circuitry is configured to verify that the selected memory cells have been programmed successfully by sensing the selected memory cells for a sensing duration that depends on the verification voltage.

6. The storage system according to claim 1, wherein the storage circuitry is configured to verify that the selected memory cells have been programmed successfully by setting a predefined bias voltage to bit lines to which the selected memory cells are coupled, so that the bias voltage depends on the verification voltage.

7. A method for data storage, comprising:

in a storage apparatus that comprises a plurality of memory cells coupled to multiple word lines (WLs), the memory cells store data values in multiple respective predefined programming levels, receiving data values for storage in the memory cells of a given WL;

selecting memory cells of the given WL that are to store a given data value among the received data values;

setting a verification voltage for programming the selected memory cells, so that a difference between the verification voltage and a read voltage predetermined for the selected memory cells depends on a rate of drift that is expected to occur to a threshold voltage distribution (TVD) associated with the selected memory cells when programmed, by:

holding a predefined dependency between verification voltages and (i) the given data value, and (ii) one or both of a first neighbor data value previously stored in first neighbor memory cells neighboring the selected memory cells, and a second neighbor data value to be programmed in second neighbor memory cells neighboring the selected memory cells; and setting the verification voltage using the predefined dependency;

applying one or more programming pulses to the given WL; and verifying that the selected memory cells have been programmed successfully using the set verification voltage.

8. The method according to claim 7, and comprising reading the first neighbor memory cells using one or more read thresholds that divide a threshold voltage axis to two or more ranges, and setting the verification voltage based on the given data value and on the ranges to which the first neighbor memory cells belong.

9. The method according to claim 7, and comprising programming the selected memory cells using a coarse programming phase and a fine programming phase, and setting the verification voltage for performing the fine programming phase.

10. The method according to claim 7, wherein verifying that the selected memory cells have been programmed successfully comprises verifying that the selected memory cells have been programmed successfully by using the set verification voltage for reading the selected memory cells.

11. The method according to claim 7, wherein verifying that the selected memory cells have been programmed successfully comprises sensing the selected memory cells for a sensing duration that depends on the verification voltage.

12. The method according to claim 7, wherein verifying that the selected memory cells have been programmed successfully comprises setting a predefined bias voltage to bit lines to which the selected memory cells are coupled, so that the bias voltage depends on the verification voltage.

* * * * *